United States Patent [19]
Meador et al.

[11] Patent Number: 5,926,514
[45] Date of Patent: Jul. 20, 1999

[54] APPARATUS FOR CLOCK SHIFTING IN AN INTEGRATED TRANSCEIVER

[75] Inventors: Richard B. Meador; Walter H. Kehler, both of Sunrise, Fla.; Joseph E. Phillips, Huntley, Ill.

[73] Assignee: Motorola, Inc., Schaumburg, Ill.

[21] Appl. No.: 08/805,874

[22] Filed: Mar. 3, 1997

[51] Int. Cl.$^6$ .............................. H03D 1/04; H03K 5/01; H04B 1/10; H04L 1/00

[52] U.S. Cl. .................. 375/346; 375/219; 375/371; 455/296

[58] Field of Search ................................. 375/219, 316, 375/346, 349, 350, 354, 371; 455/296, 73, 77

[56] References Cited

U.S. PATENT DOCUMENTS

| | | | |
|---|---|---|---|
| 5,225,792 | 7/1993 | Prakash | 331/158 |
| 5,454,118 | 9/1995 | Simmons et al. | 455/221 |
| 5,734,975 | 3/1998 | Zele et al. | 455/307 |
| 5,745,848 | 4/1998 | Robin | 455/296 |

Primary Examiner—Chi H. Pham
Assistant Examiner—Bryan Webster
Attorney, Agent, or Firm—Barbara R. Doutre

[57] ABSTRACT

A radio (100) having an integrated transceiver circuit (102) avoids circuit crosstalk through the use of a clock shifter circuit (120). The radio includes a microcontroller unit (MCU) (104) controlled by a MCU clock. A channel selector (116) coupled to the MCU (104) provides a selected frequency channel while memory (106) downloads channel information which includes integer clock shifter ratios assigned to each channel. The integrated transceiver (102) includes a clock shifter circuit (120) which divides a reference signal into a clock frequency and provides this clock frequency to the MCU (104) as the MCU clock. The MCU (104) reprograms the clock shifter circuit (120) with one of the integer clock shifter ratios to generate a shifted MCU clock frequency if the selected frequency channel is susceptible to harmonics of the MCU clock.

12 Claims, 4 Drawing Sheets

APPARATUS FOR CLOCK SHIFTING IN AN INTEGRATED TRANSCEIVER

CROSS REFERENCE TO RELATED APPLICATIONS

This application is related to U.S. application Ser. No. 08/805,875 filed Mar. 3, 1997, by Meador, et al., entitled "Technique for Clock Shifting in an Integrated Transceiver," and assigned to Motorola, Inc.

TECHNICAL FIELD

This invention relates in general to interference of transceiver signals caused by circuit crosstalk and more specifically to a technique and apparatus of clock shifting and timing compensation to minimize such interference in transceiver circuits.

BACKGROUND

The trend in radio communications systems is toward higher levels of integration to achieve performance, cost, size, and power dissipation goals. The greatest single barrier to higher integration is the undesired interaction or crosstalk that exists between circuits as more circuits are combined on fewer integrated circuits (ICs). In recent years, integration has advanced to the point that researchers have introduced the concept of a "single chip transceiver IC". In particular, communication devices such as frequency modulated (FM) portable radios, cellular phones, and packet radios would feature all of the transmit and receive functions on a single IC substrate with the programmable features and user interface functions performed by a second IC such as low-cost micro-controller unit (MCU).

This "single chip transceiver IC" programmed and controlled by an MCU has obvious implementation problems in regards to undesired circuit crosstalk with dozens if not hundreds of circuits located on the same IC substrate. For example, a state of the art communication device such as a narrow band FM transceiver can receive and demodulate an extremely low-level RF signal. The signal level may be 1 microvolt ($\mu V$) or less. This same FM transceiver is commonly controlled by a MCU that has digital clock signals with amplitudes in the 2.7 to 5 V range. The digital clock signals which are routed both on-chip and off-chip, conduct and radiate higher-order harmonic signals that can interfere with the desired incoming RF signal and/or a mixed down product of the desired RF signal. The higher-order harmonics may also fall exactly at the desired RF frequency and appear to the receiver as a valid incoming signal. In this case, the FM receiver would exhibit desense known as "self-quieting" due to the undesired unmodulated signal causing the FM receiver to mute (or quiet) with no discernible audio output. The undesired signal is known as a self-quieting spur.

Receiver desense may be caused by any digital or analog signal (or harmonic thereof) but most often occurs at harmonics of the MCU's input clock signal or harmonics of the MCU's internal system clock (e.g. E clock). The self-quieting spurs most likely occur at harmonics of the MCU's clock signals, because these signals drive a large number of devices both on the MCU and on the external input/output (I/O) addressing. The switching of a large number of devices creates transient currents on the supply and ground lines. The high harmonic content of the switching transients results in the desense of receiver circuits that operate at the same frequency or a mixed down frequency that is equal to a particular MCU clock harmonic frequency. Therefore, a means to prevent the desense of the highly sensitive transceiver circuits due to the crosstalk of the digital clock signals is desired.

In the past, decoupling and shielding techniques have been used on the supply and ground lines to prevent undesired coupling of the harmonics onto the receiver circuits. However, shielding and decoupling components can be costly and also have a negative impact in terms of radio size, parts count, and ease of assembly. Shielding at the IC level is also costly and difficult to implement and requires multiple metallization layers.

Another approach to MCU desense of the receiver is to shift the frequency of the oscillator that produces the MCU's input clock signal to an alternative frequency. This approach is feasible because the MCU clock frequency and the user's assigned receiver frequencies are known values at the time of radio assembly and programming. The user typically selects the frequency from a front panel selector. Because the MCU clock frequency and the user's assigned receiver frequencies are known, a self-quieting spurious analysis is first performed prior to radio programming to determine if a harmonic of any of the MCU clocks falls within the receiver bandwidth of any of the user's assigned receiver frequencies. If an MCU harmonic frequency falls within the receiver bandwidth of an assigned receiver frequency, the radio is programmed to automatically shift the MCU crystal oscillator approximately 1000 Hz above (or below) its nominal frequency. This action moves the undesired MCU clock harmonic signal from $F_{UNSHIFTED}=N\times F_{MCU}$ to $F_{SHIFTED}=N\times(F_{MCU}+1000\ Hz)$ where N is Nth harmonic of the MCU clock. The MCU clock frequency is offset only a small amount, such as 1000 hertz (Hz), because a greater frequency offset would cause shifts in the MCU's critical timing signals that are used to generate I/O functions such as audible and sub-audible signaling. In the event that an assigned receiver frequency is not located at or near any of the MCU harmonic frequencies, then no shift is required and the MCU oscillator operates at its nominal frequency ($F_{MCU}$).

The problem with the shiftable oscillator approach is a separate crystal oscillator circuit is required to generate the MCU clock signal. It is desirable to use only one reference oscillator for the entire FM transceiver. The crystal oscillator typically used to generate the reference signal for a local oscillator (LO) synthesizer cannot be shifted due to the high frequency stability requirement (typically+/−5 ppm) for the LO signal. Therefore, the FM receiver utilizing the shiftable oscillator approach has the disadvantage of requiring two oscillator circuits—one for the MCU and one for the LO synthesizer.

Another approach to avoid MCU desense of the receiver is to generate the MCU clock signal with a frequency synthesizer that can be programmed to shift the MCU clock signal approximately 1000 Hz above or below the MCU nominal clock frequency. In this approach, a single high-stability reference oscillator may be used to generate the reference signal used by both the MCU clock synthesizer and the LO synthesizer. The decision to shift the MCU clock frequency is determined by performing a self-quieting analysis as described in the second approach. However, the MCU synthesizer circuit requires a full phase lock loop (PLL) circuit including a reference divider, phase detector, voltage controlled oscillator (VCO), programmable divider, and loop filter. The loop filter typically requires a pin-out to an off-chip capacitor, and the synthesizer requires numerous programming bits to provide sufficient resolution to synthesize small clock shifts such as 1000 Hz. The overhead in terms of pin-outs, die area, number of programming bits, and testability is high with this two synthesizer approach. In addition, the additional MCU synthesizer itself is susceptible to crosstalk from other transceiver circuits located on the same substrate.

Accordingly, there is a need for an improved apparatus and technique for minimizing the desense of a received signal caused by harmonics of the MCU clock signal and/or by other master clock signals on the transceiver. To achieve high-level integration at low-cost, the apparatus must provide a solution to the desense problem but not produce undesired shifts to critically timed circuits. The apparatus itself should be immune to crosstalk from nearby circuits and require minimum die area.

DETAILED DESCRIPTION OF THE PREFERRED EMBODIMENT

The clock shifting and timing compensation method to be described herein addresses the problem of clock crosstalk and subsequent desense that occurs on highly integrated communication devices such as portable and mobile radios. Clock signals such as the MCU clocks and the switched capacitor clocks are considered to be dominant clock signals because a large amount of sub-circuits are driven by these system clocks. Harmonics of these clock signals often cause interference at the assigned RF frequencies of the communication device.

Figure 1:
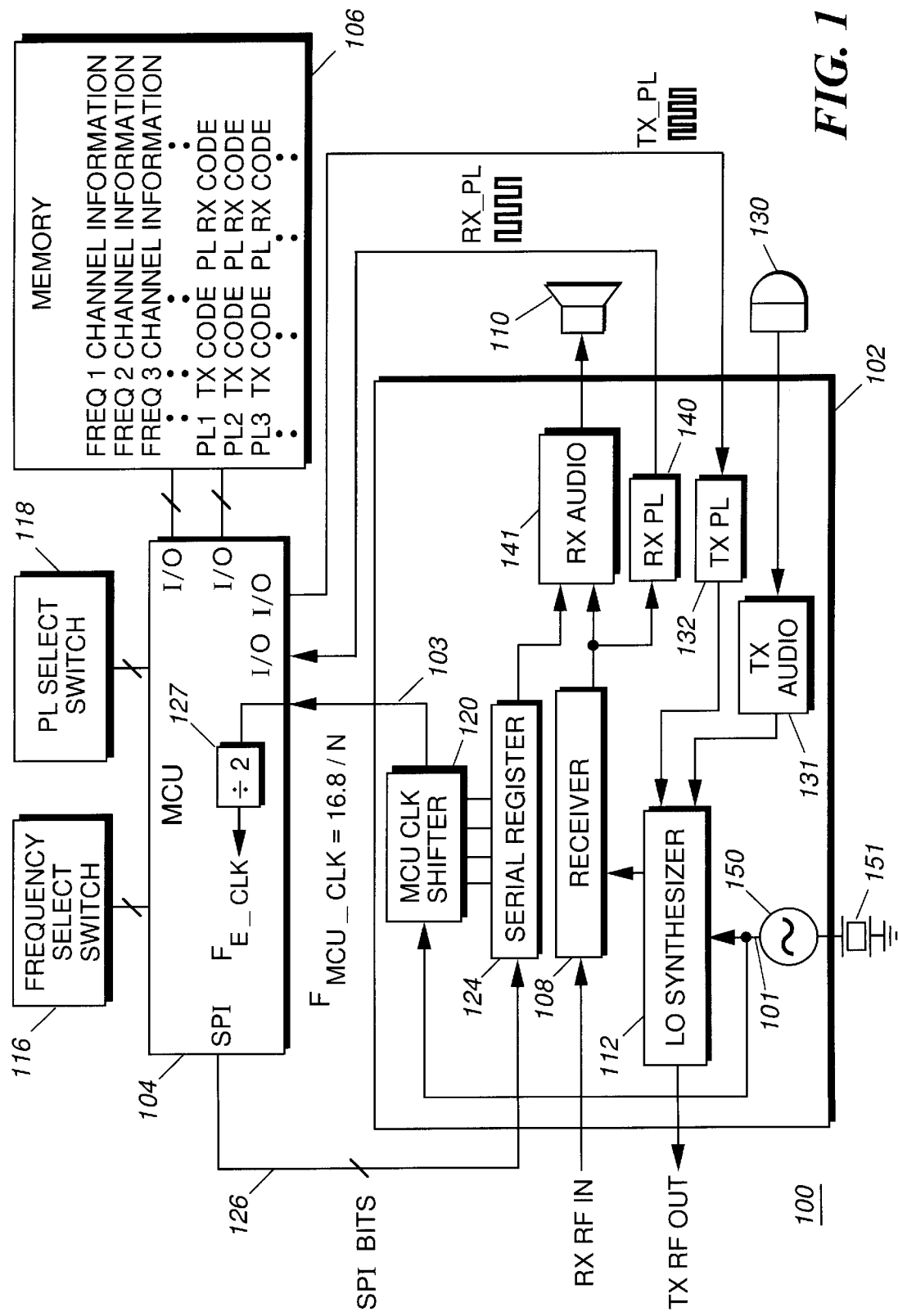
FIG. 1 is a partial radio block diagram including an MCU clock frequency shifter in accordance with the present invention.

Referring now to FIG. 1, there is shown a partial radio block diagram 100 including a highly integrated transceiver IC 102 under the control of a MCU 104 in accordance with the present invention. MCU 104 preferably comprises a μP, such as the MC6805xx manufactured by Motorola, Inc., and utilizes on-chip memory and preferably external memory 106. Included within transceiver IC 102 is receiver 108 which is comprised of zero-IF (zero intermediate frequency) circuitry and demodulation circuitry.

The transceiver IC 102 operates in the transmit and receive modes. In the transmit (Tx) mode, the Tx RF output signal is generated from a local oscillator (LO), typically a voltage controlled oscillator (VCO), located within a LO Synthesizer 112. The Tx RF output signal is modulated by the amplified and filtered voice signal from a Tx audio stage 131. The frequency modulator (not shown) is located within LO synthesizer 112. Typically the voice signal is input to the Tx audio stage 131 from microphone 130. In addition, signaling information such as tones or data are modulated on the RF carrier to pass information or to enable selective individual or group calling. For example, sub-audible private line tones (PL tones) are generated by a staircase generator (not shown) in a TX_PL stage 132. The timing reference for the PL tones is a digital clock signal generated by the MCU firmware and routed to the input of the TX_PL stage 132.

In the receive mode, the voice modulation on the RF signal is received, converted to baseband, and demodulated by receiver 108 and amplified and filtered in Rx audio stage 141. The PL signal also encoded on the received RF signal is demodulated within the receiver 108, filtered and amplitude limited by Rx PL stage 140. The amplitude-limited PL signal (Rx_PL) is then routed to the MCU in which a processing algorithm is used to decode the frequency of the PL signal. If the frequency of the PL tone matches the PL tone assigned the channel, the MCU enables the voice signal to the speaker 110 by serial port interface (SPI) programming of the audio enable input of Rx audio stage 141.

A frequency selector, such as frequency select switch 116, allows the user to select a channel frequency such as one of sixteen RF channel frequencies pre-programmed in memory 106. The user may also select one of 39 PL tones using PL selector 118. The PL tones typically range in frequency from 67 to 250 Hz in 3–6 Hz increments. The MCU senses the output lines of the frequency and PL selectors and programs the transceiver IC 102 to transmit and receive on the selected frequency utilizing the selected PL tone.

In accordance with the present invention, transceiver 102 further includes reference oscillator 150 with frequency operation set by a crystal 151, preferably a 16.8 MHz crystal. The reference oscillator 150 provides a high stability reference signal 101 to MCU clock shifter 120 and to the LO synthesizer 112. The MCU clock shifter circuit 120 is comprised of a frequency divider to provide a divide ratio of 4, 5, 6, 7, 8, 9, 10, 12, 13, 14, 15, 16, and 17 dependent on a 4 bit logic sent by the MCU through the serial port interface (SPI) 126. The divider is a binary counter preferably comprised of D flip flops (to be described in detail in FIG. 2) whose outputs are selected by combination logic gates so that the half duty cycle of the of the divided down signal is substantially 50%+/−10%. The digital output from MCU clock shifter 120 provides the MCU clock frequency 103. A fixed divider stage 127 internal to the MCU divides the MCU clock frequency, typically by 2, producing the system clock (MCU E_CLK) for the MCU's internal functions and external I/O control.

The purpose of the MCU clock shifter 120 of the present invention is to provide a means to produce a shiftable MCU clock frequency in the event that a harmonic of the MCU clock or a harmonic of a derivative clock such as the MCU E_CLK interferes with the reception of the desired RF signal in receiver 108. Harmonics of the MCU clocks may also cause interference with other transceiver functions such as the LO synthesizer. The MCU clock shifter 120 allows a large shift to an alternative MCU clock frequency in the event of such interference. The following table shows the available MCU clock frequencies for a reference signal of 16.8 MHz:

| DIVIDER RATIO | MCU CLOCK FREQ | DUTY CYCLE |
| --- | --- | --- |
| 4 | 4.20 MHz | 50/50 |
| 5 | 3.36 | 40/60 |
| 6 | 2.80 | 50/50 |
| 7 | 2.40 | 43/57 |
| 8 | 2.10 | 50/50 |
| 9 | 1.87 | 44/56 |
| 10 | 1.68 | 40/60 |
| 12 | 1.40 | 50/50 |
| 13 | 1.29 | 46/54 |
| 14 | 1.20 | 50/50 |
| 15 | 1.12 | 47/53 |
| 16 | 1.05 | 50/50 |
| 17 | 0.99 | 47/53 |

The MCU clock shifter 120 may be programmed on a per channel basis to provide a means to shift the MCU clock frequency to avoid receiver desense. For example, for a divide ratio of N=16, the 1.05 MHz MCU clock signal consists of harmonics at K×1.05 MHz where K=1,2,3 . . . inf. The MCU's E_Clock frequency would be 525 KHz with harmonics occurring at n×525 KHz where n=1,2,3 . . . inf. In the event an MCU clock harmonic falls within the bandwidth of the desired RF channel, the MCU clock shifter is programmed to an alternative frequency. Programming the clock shifter 120 to a divide by 15 results in an MPU clock frequency of 1.12 MHz. This shifts the MPU clock harmonics to K×1.12 MHz and the E_Clock harmonics to n×560 KHz. To determine if a clock harmonic falls on a desired RF channel, a spurious analysis is performed prior to radio programming. As a brief example, a partial listing of the harmonics for a 1.05 MHz MCU clock is provided for a 10 MHz band ranging from 150 to 160 MHz—assume a typical receiver bandwidth equal to 25 KHz.

| | |
|---|---|
| K = 143 | 150.150 MHz |
| K = 144 | 151.200 MHZ |
| K = 145 | 152.250 MHz |
| K = 146 | 153.300 MHz |
| K = 147 | 154.350 MHz |
| K = 148 | 155.400 MHz |
| K = 149 | 156.450 MHz |
| K = 150 | 157.500 MHz |
| K = 151 | 158.550 MHz |
| K = 152 | 159.600 MHz |

From the table, there are 10 MCU clock harmonics that fall within the 10 MHz band. For a user requesting an RF channel at 155.400 MHz, an MCU clock harmonic (K=150) would fall exactly in the 25 KHz bandwidth of the receiver. However, programming the MCU clock frequency to 1.15 MHz shifts the harmonics as follows:

| | |
|---|---|
| K = 131 | 150.650 MHz |
| K = 132 | 151.800 MHZ |
| K = 133 | 152.950 MHz |
| K = 134 | 154.100 MHz |
| K = 135 | 155.250 MHz |
| K = 136 | 156.400 MHz |
| K = 137 | 157.550 MHz |
| K = 138 | 158.700 MHz |
| K = 139 | 159.850 MHz |

From the table, the closest MPU clock harmonic to the desired RF channel of 155.400 MHz is 155.250 MHz which is well outside the 25 KHz bandwidth of the receiver. Extending this analysis, a MCU clock frequency can be pre-determined for all user channels in a given band to avoid the possibility of a clock harmonic falling within the receiver bandwidth.

In accordance with the present invention, the user's desired RF channels are encoded and programmed into the MCU's memory 106 along with the optimum MCU clock frequency on a per channel basis. As the user selects a channel using the frequency selector 116, the MCU senses the output of the frequency selector and programs the transceiver IC 102 via the SPI with the channel information stored in memory 106. Included in the channel information are the LO synthesizer bits to program the LO synthesizer 112 to the desired channel and MCU Clock shifter bits that set the MCU clock frequency.

Ordinarily, the large shift in the MCU clock frequency would cause failure of the PL encoding and decoding algorithms because the algorithms require a high stability timing reference. However, the following method can be used to reprogram the PL timing constants stored in memory 106 when and if a clock shift occurs.

In the transmit mode, PL generation is achieved by the MCU 104 presenting a clock input (TX_PL) to the TX_PL stage 132 of the transceiver IC. This clock signal (TX_PL) operates as the clocking input to a 6 level step generator (not shown) in the TX_PL stage 132. To produce a particular PL frequency, the MCU 104 must generate a clock at the TX_PL input of the transceiver 102 that is 12 times the PL frequency, 6 steps up and 6 steps down continuously during transmit. The particular PL frequency used by the radio 100 is selected through a PL selector, such as a PL select switch 118. Each selector position corresponds to a PL transmit code stored in the MCU memory. In accordance with the present invention, the PL codes are stored as binary bits in the MCU's memory according to the following equation:

$$TX\_PL\_CODE\ (Hex) = F_{E\_CLK}/(12 * F_{PL}),$$

where:
$F_{E\_CLK}$=the internal clock rate of the MCU
$F_{E\_CLK}$=½×$F_{MPU\_CLK}$.
$F_{PL}$=frequency of a particular PL code.
For an MCU clock of 1.05 MHz and a PL frequency of 192.8 Hz, the equation is resolved as follows:

$$TX\_PL\_CODE = 525e3/(12*192.8) = 226.919 \approx 227 = \$00E3$$

Thus, when the selector position is set for a channel PL tone of 192.8 Hz, MCU 104 reads the value $00E3 in memory 106. The code within the MCU 104 inputs this value along with a timer subsystem (not shown) for toggling an output compare port on each half cycle of the required Tx_PL clock. Now if the external MCU clock signal is shifted from 1.05 MHz to 1.20 MHz with the clock shifter 120 of the present invention, the frequency of the PL tone will also be shifted to:

$$F_{PL} = 600e3/\ (12*227) = 220.264\ Hz$$

Therefore, without compensation for the MCU clock shift, the PL frequency has been shifted more than 25 Hz from the desired 192.8 Hz tone. To compensate for the MCU clock shift, the MCU firmware selects an alternative TX_PL_CODE. This value is calculated as following:

$$TX\_PL\_CODE\ (shifted) = 600e3/(12*192.8) = 259.336 \approx 259 = \$0103$$

Therefore, two TX_PL_CODE values are stored in the MCU memory 106. If the MCU clock is shifted to an alternate frequency, the TX_PL_CODE is also programmed to the alternate TX_PL_Code. Thus, by storing the code values in memory, one for the unshifted clock case and one for the shifted case, the proper MCU timing can be selected to properly process the signaling information.

For operation of the transceiver in the receive mode, timing compensation for a MCU clock shift is also required. In the receive mode, the PL decoder algorithm of the present invention is a correlation type algorithm. Basically, this algorithm samples the filtered and limited waveform provided by the transceiver output pin (RX_PL) at a predetermined rate, preferably 1 KHz, and performs a correlation calculation on the data. A timer input capture subsystem on the MCU is used to reduce any jitter problems with the samples due to code execution latency.

For each PL position on the PL selector 118, a value is stored to represent the desired correlation frequency. For coding efficiency, the code is stored in the radio memory 106 according to the following calculation:

$$RX\_PL\_CODE\ (Hex) = F_{E\_CLK}/(4 * F_{PL}),$$

Using the same values as described in the previous transmit example, a PL tone of 192.8 Hz results in the following storage value:

RX_PL_CODE=(525e3)/(4*192.8)=680.7≈681=$02A9

If the external MCU clock signal is changed from 1.05 MHz to 1.20 MHz, using the clock shifter circuit 120 of the present invention, a significant error would result. Instead of detecting a PL frequency of 192.8 Hz, the radio would detect a PL tone at the following frequency:

$F_{PL}$=600e3/ (4*681)=220.3 Hz

To compensate for the MPU clock shift, the MPU firmware selects an alternate PL code stored in memory 106 when the external MCU clock is shifted to 1.2 MHz. This value would be the following:

RX_PL_CODE=(600e3)/(4*192.8)≈778=$030A

If the MCU clock input is shifted from 1.05 MHz to 1.20 MHz to avoid an MCU clock harmonic, the corresponding shifted RX_PL_CODE value will be retrieved from the MCU's memory.

The MCU clock shifter circuit 120 and method of reprogramming PL frequencies described by the invention provide a low cost solution to the MCU induced interference without the requirement of a full MCU clock synthesizer. The clock shifter circuit described by the invention is integrated within a transceiver IC taking up minimal die space and without the use of off-chip components. The clock shifter circuit itself is much less susceptible to crosstalk from nearby circuits than a full MCU clock synthesizer used in prior art.

Figure 2:
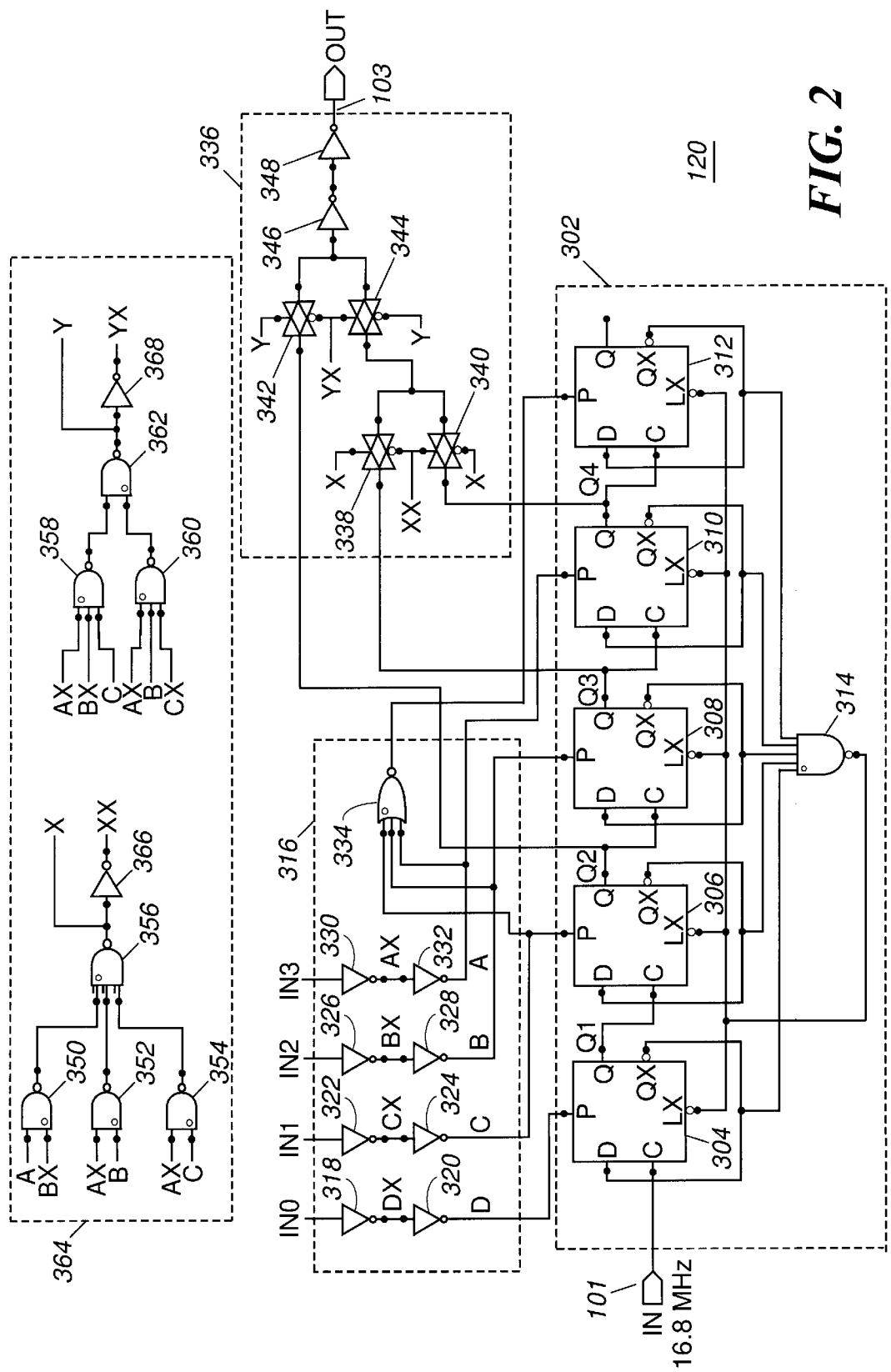
FIG. 2 is the preferred implementation of the MCU clock shifter circuit of FIG. 1.

Referring now to FIG. 2, there is shown the preferred implementation of the MCU clock shifter stage 120 of FIG. 1 in accordance with the present invention. The input signal 101 of preferably 16.8 MHz is applied to the input stage of a programmable 5-bit binary counter 302 consisting of D-type flip flops 304, 306, 308, 310, 312 and a 5-input NAND gate 314. An input decoder circuit 316 preferably comprises eight inverters 318, 320, 322, 324, 326, 328, 330, 332 and a 3-input NOR gate 334. The input decoder circuit 316 decodes the four control inputs (IN0 to IN3) and loads the initial count value of the 5-bit counter to 1 of 16 values (00010 to 10001). Three output signals (Q2, Q3, and Q4) are generated by the 5-bit binary counter and are applied to the input of the 1-of-3 multiplexer 336. The multiplexer 336 consists of transmission gates 338, 340, 342, 344 and inverters 346, 348. The multiplexer 336 is controlled by control logic stage 364 which consists of NAND gates 350, 352, 354, 356, 358, 360, 362 and inverters 366, 368. The control logic stage 364 receives inputs from decoder stage 316 and selects one of the three signals (Q2, Q3, Q4) as the output signal of multiplexer 336. The control logic stage 364 selects the output signal from the 5-bit counter that provides a frequency divide ratio of 2-17 dependent on control inputs (IN0 to IN3). The duty cycle of several of the divided down signals that are present at Q2, Q3, and Q4 varies from the desired 50/50 duty cycle. If two signals are present at Q2, Q3, and Q4 that have identical divide ratios but different duty cycles, decoder logic stage 364 selects the signal that exhibits a duty cycle closest to 50/50. For example, for divide by 4 operation, the control inputs are programmed to IN3=0, IN2=1, IN1=0, and IN0=0. The 5-bit counter's parallel load value (Q4 to Q1) is initially 0100. As the 5-bit counter 302 is clocked by the 16.8 MHz input signal 101, both Q2 and Q3 exhibit the desired "divide by 4" output signal but the duty cycle at Q2 is 50/50 cycle versus a 25/75 cycle at Q3. Therefore, the control logic stage 364 selects the signal at Q2 to pass through multiplexer 336 as the output signal 103 of the MCU clock shifter 120. Providing a clock signal with a duty cycle of 40/60 or a requirement for most microcontrollers.

Other dominant or master clock signals may exist on radio communication devices especially for the case where switched capacitor circuits are used for signal processing. Switched capacitor circuits provide precise filter functions and are commonly used for highly integrated designs. The switched capacitor circuits are driven by one or more system clocks similar to the MCU clocks. Because one clock may drive many circuits, transient currents induce high order harmonics in the same manner as for the MCU clocks.

Figure 3:
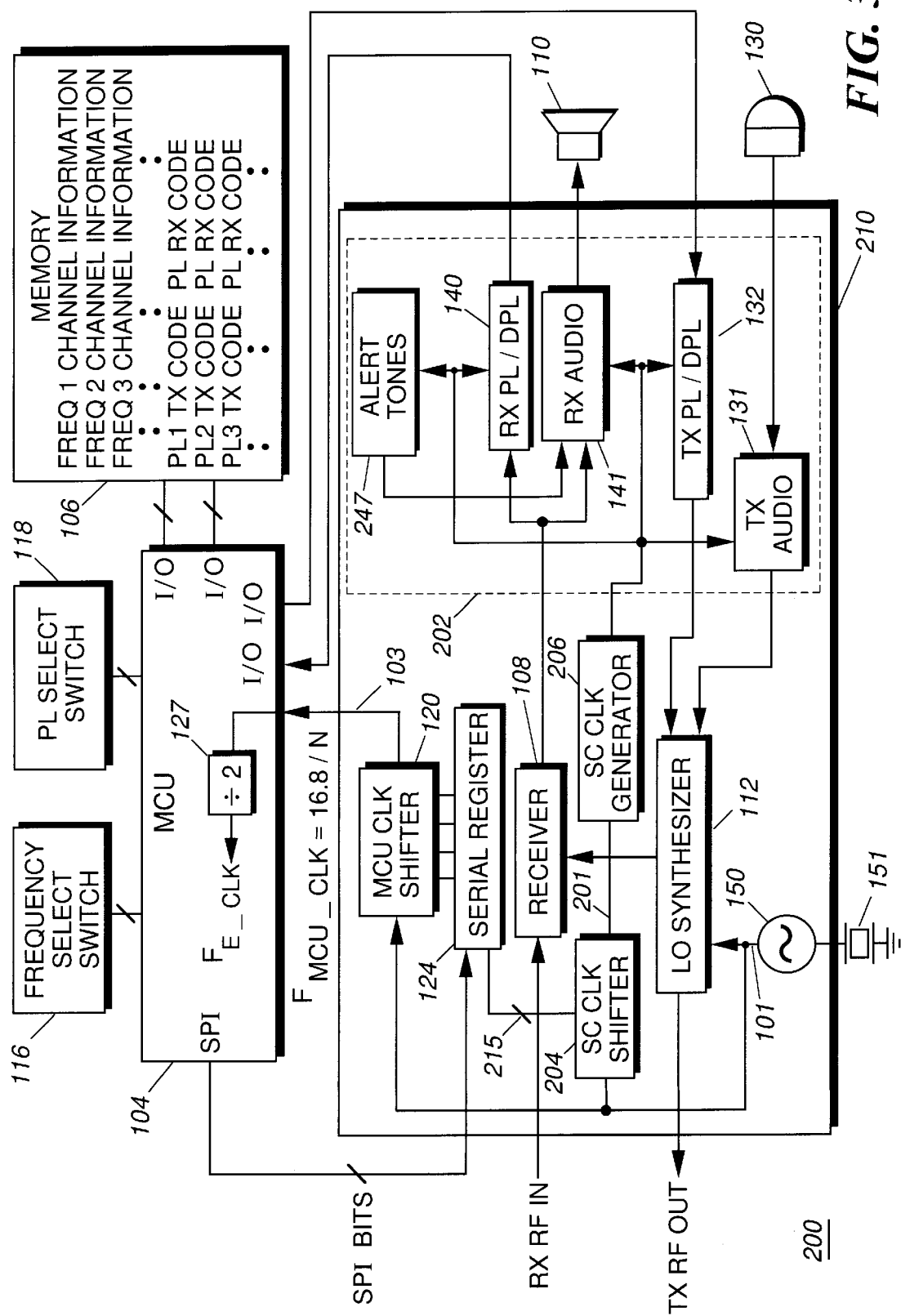
FIG. 3 is a partial radio block diagram including a switched capacitor clock frequency shifter in accordance with a second embodiment of the invention.

In FIG. 3, in accordance with another embodiment of the invention, there is shown a partial radio block diagram 200 which includes audio processing circuits 202 utilizing switched capacitor technology as well as the MCU clock shifter 120, with like numerals carried forward from FIG. 1. These switched capacitor circuits are preferably used for low frequency processing. Switched capacitor technology allows implementation of the audio processing blocks of transceiver IC 210 with minimal die area while maintaining high performance. The switched capacitor circuits 202 provide all functions necessary to process voice, signaling, and data for both the receive and transmit audio modes.

In accordance with this embodiment of the invention, the partial radio diagram 200 further includes a switched capacitor (SC) clock shifter 204 and a switched capacitor clock generator circuit 206. Serial register 124 provides a means for programming the frequency divide ratio of the SC clock shifter 204 in accordance with the invention. The SC clock shifter 204 is comprised of a frequency divider with programmable divide ratios of 56 and 58. The divide ratios are controlled by a 1-bit programming line 215 routed from serial register 124 and connected to the shift enable input of SC clock shifter 204. The input signal 101 to the SC clock shifter 204 is derived from reference oscillator 150 and is preferably 16.8 MHz. For the shift enable input programmed LOW, the output frequency signal 201 of SC clock shifter 204 is 300 KHz. For the shift enable programmed HIGH, the SC clock shifter output is 289.6552 KHz producing a clock shift of 3.45 percent. The switched capacitor clock generator 206 further divides the SC clock shifter output signal 201 and produces the required clock frequencies and clock phases for the numerous switched capacitor circuits 202. Harmonics of these switched capacitor clocks may cause radio desense problems as previously described for the MCU clocks.

For example, the possibility of self-quieting spurs occurs at high order harmonics of 300 KHz such as 300 KHz×600= 180.000 MHz which creates potential on-channel interference for a transceiver with say a 180.000 MHz channel frequency and a channel bandwidth of 25 KHz. A 3 percent shift in the 300 KHz signal provided by the SC clock shifter 204 to 289.6552 KHz moves the harmonic interference of the switched capacitor clock off the desired 180 MHz channel:

289.6552 *KHz*×600 $^{th}$ harmonic=173.793 *MHz*.

The closest harmonics of the shifted 289.65 KHz SC clock signal to the desired 180.000 MHz receiver frequency are:

289.6552 *KHz*×621 $^{th}$ harmonic=179.875879 *MHz*, and 289.6552 *KHz*×622 $^{th}$ harmonic=180.165534 *MHz*.

The closest harmonics are well outside the 25 KHz bandwidth of the desired 180.000 MHz channel.

The decision to shift the frequency of the switched capacitor clock generator 206 is determined on a per channel basis prior to radio programming by a spurious analysis similar to the example of the 180.000 MHz channel interference caused by the 300 KHz clock. The spurious analysis provides a list of the channel frequencies that may exhibit interference caused by harmonics of the switched capacitor clocks thereby indicating if a shift is required for each of the user's 16 channel frequencies. This per channel information is encoded in MCU memory 106. As the user selects a channel using the frequency selector switch 116, the MPU senses the position of the selector and loads the corresponding channel information from memory 106 to the serial register 124 of the transceiver IC 210.

For the present invention, a shift in the switched capacitor clock frequency of 3.45 percent does not adversely affect the transceiver functions. Audible alert tones 247, such as low battery alert tones, are generated in a tone generator and applied through Rx audio stage 141 to speaker 110. In accordance with the present invention, the alert tones 247 will be shifted in frequency if the switched capacitor clock frequency is shifted. However, this small percentage shift of approximately 3.45 percent is negligible. The switched capacitor filters included within the Rx audio stage 141, Rx PL stage 140, TX_PL stage 132, and Tx audio stage 131 are also not adversely affected by the small percent shift in their input clock frequencies. For example, the corner frequency of a 100 Hz low-pass filter would be shifted only about 3–4 Hz which is acceptable for most applications. Signaling functions such as receive and transmit PL signaling are not adversely affected by the SC clock shifter 204, because the timing is derived from the MCU clock frequency and not the switched capacitor frequency.

The SC clock shifter 204 provides a low cost solution to the switched capacitor clock interference. The circuit is readily integrated on chip without external pin outs or off-chip components and the encoding of the shift bit requires a minimal amount of memory. The MCU clock shifter with timing compensation and the SC clock shifter described by the invention can be adapted to avoid interference such as beat notes caused by combinations of crosstalk signals. The clock shifter circuits and timing compensation described by the invention provide a means of addressing circuit crosstalk to achieve higher levels of integration.

Figure 4:
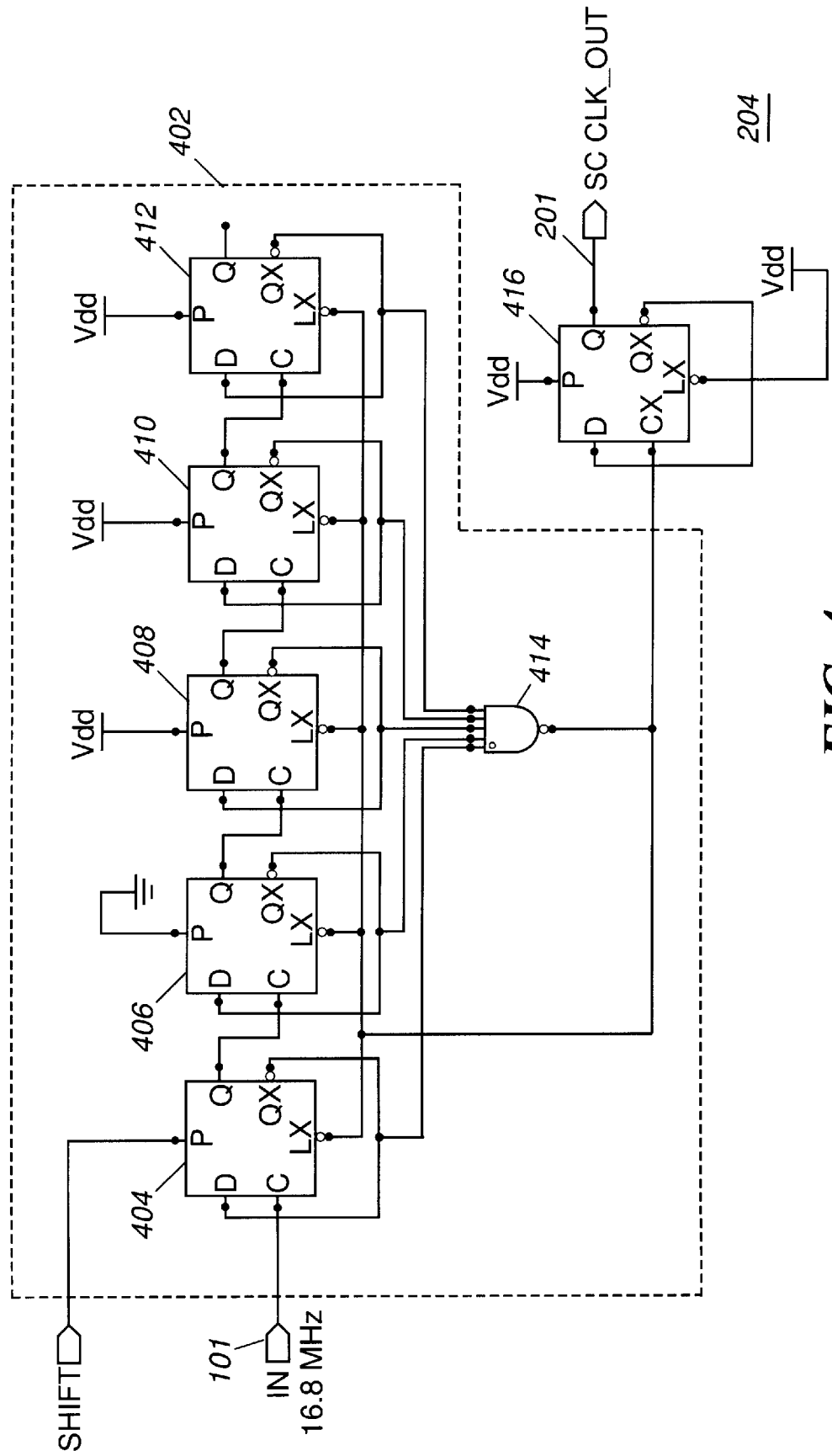
FIG. 4 is the preferred implementation of the SC clock shifter circuit of FIG. 3.

Referring now to FIG. 4, there is shown the preferred implementation of the SC clock shifter circuit 204. The SC clock shifter 204 preferably includes a 5-bit binary counter 402 formed of D flip flops 404, 406, 408, 410, 412. Counter 402 divides the input signal 101 by preferably 28 or 29 depending on the value of 1-bit control line (SHIFT). The pulsed output signal of the counter's reset NAND gate 414 is applied to the clockX input of a D-type flip flop 416. The D flip flop 416 divides the input signal by 2 to give a combined divide ratio of 56 or 58 at the SC clock shifter output 201.

To summarize, there has been provided a radio having an integrated transceiver circuit which avoids circuit crosstalk through the use of the clock shifter circuit 120 described by the invention. Radio 100 includes MCU 104 controlled by the MCU clock signal 103. Channel selector 116 coupled to the MCU 104 provides a selected frequency channel while memory 106 downloads channel information including predetermined integer clock shifter ratios assigned to each selected frequency channel. The reference oscillator 150 generates a reference signal for the transceiver and includes first clock shifter circuit 120 which divides the reference signal into a first clock frequency and provides this first clock frequency to the MCU as the MCU clock signal 103. In accordance with the present invention, the MCU reprograms the first clock shifter circuit 120 with one of the predetermined integer clock shifter ratios to generate a shifted MCU clock frequency if the selected frequency channel is susceptible to harmonics of the MCU clock signal or internal subdivisions of the MCU clock signal. The integrated clock shifter apparatus of the present invention allows a radio to have the advantage of a programmable MCU clock signal. Additionally, another advantage of a radio implementing the clock shifter described by the invention is that the memory 106 can include a private line (PL) timing constant which can be reprogrammed concurrently with the shifted MCU clock signal.

In accordance with a further embodiment of the invention, second clock shifter circuit 204 can be implemented within integrated transceiver 210 to control switched capacitor circuits 202. The second clock shifter circuit 204, also coupled to the serial register 124 and the reference oscillator 150, provides a switched capacitor clock frequency to the plurality of switched capacitor circuits 202. In accordance with this embodiment of the invention, the MCU (104) reprograms, through the serial register 124, the second clock shifter circuit 204 to generate a shifted switched capacitor clock frequency in response to the selected frequency channel being susceptible to predetermined spurious harmonics of the switched capacitor clock frequency or subdivisions of the switched capacitor clock frequency.

Numerous modifications, changes, variations, substitutions, and equivalents will occur to those skilled in the art without departing from the spirit and scope of the present invention as defined by the appended claims.

What is claimed is:

1. A radio, comprising:
  a microcontroller unit (MCU) controlled by an MCU clock signal;
  a channel selector coupled to the MCU, the channel selector providing a selected frequency channel;
  memory coupled to the MCU, the memory including channel information for each selected frequency channel, the channel information including predetermined integer clock shifter ratios assigned to each selected frequency channel;
  a reference oscillator generating a reference signal;
  a transceiver coupled to the reference oscillator, the transceiver including;
    a first clock shifter circuit for dividing the reference signal into a first clock frequency and providing the first clock frequency to the MCU as the MCU clock signal;
    the MCU reprogramming the first clock shifter circuit with one of the predetermined integer clock shifter ratios to generate a shifted MCU clock frequency if the selected frequency channel is susceptible to harmonics of the MCU clock signal.

2. The radio of claim 1, wherein the memory includes private line (PL) timing constants which are reprogrammed concurrently with the shifted MCU clock signal.

3. The radio of claim 1, wherein the MCU clock signal is programmable.

4. The radio of claim 1, further comprising:
  a plurality of switched capacitor circuits;
  a second clock shifter circuit for dividing the reference oscillator frequency into a switched capacitor clock frequency, the switched capacitor clock frequency controlling the switched capacitor circuits;
    the MCU reprogramming the second clock shifter circuit with another predetermined integer clock shifter ratio to generate a shifted switched capacitor clock frequency if the selected frequency channel is susceptible to harmonics of the switched capacitor clock frequency.

5. The radio of claim 1, wherein the first clock shifter circuit includes logic for selecting a minimum duty cycle for the shifted MCU clock frequency.

6. A radio, comprising:

a microcontroller unit (MCU) receiving a MCU clock signal, the MCU generating internal subdivided MCU clock signals;

memory coupled to the MCU for storing channel information, said channel information including predetermined MCU clock shifter ratios and predetermined switched capacitor clock shifter ratios;

a frequency selector for selecting a frequency channel, the frequency selector being coupled to the MCU, the channel information being downloaded from memory into the MCU for the selected frequency channel;

the MCU programming data representing the MCU clock shifter ratios and the switched capacitor clock shifter ratios for the selected frequency channel;

a reference oscillator providing a reference frequency;

a transceiver coupled to the MCU, the transceiver including:

a serial register for receiving the data representing the MCU clock shifter ratios and the switched capacitor clock shifter ratios;

a first clock shifter circuit coupled to the serial register and the reference oscillator, the first clock shifter circuit being programmed through the serial register to generate the MCU clock signal;

a second clock shifter circuit coupled to the serial register and the reference oscillator, the second clock shifter circuit being programmed through the serial register to provide a switched capacitor clock frequency;

a plurality of switched capacitor circuits responsive to the switched capacitor clock frequency;

the MCU reprogramming, through the serial register, the first clock shifter circuit to generate a shifted MCU clock frequency in response to the selected frequency channel being susceptible to predetermined spurious harmonics of the MCU clock signal or internal subdivisions of the MCU clock signal; and the MCU reprogramming, through the serial register, the second clock shifter circuit to generate a shifted switched capacitor clock frequency in response to the selected frequency channel being susceptible to predetermined spurious harmonics of the switched capacitor clock frequency or subdivisions of the switched capacitor clock frequency.

7. The radio of claim 6, wherein the MCU concurrently reprograms a predetermined signaling timing constant when the shifted MCU clock frequency is generated.

8. The radio of claim 7, wherein the predetermined signaling timing constant determines a private line (PL) tone.

9. The radio of claim 6, wherein the plurality of switched capacitor circuits includes switched capacitor filters.

10. The radio of claim 6, wherein the MCU clock signal is programmable.

11. The radio of claim 6, wherein the first clock shifter circuit includes logic for selecting a minimum duty cycle for the shifted MCU clock frequency.

12. A radio, comprising:

a microcontroller unit (MCU) for receiving a MCU clock signal;

a memory coupled to the MCU;

a serial register coupled to the MCU;

a first clock shifter circuit coupled to the serial register and generating the MCU clock signal;

a second clock shifter circuit coupled to the serial register to provide a switched capacitor clock frequency;

a plurality of switched capacitor circuits responsive to the switched capacitor clock frequency;

a frequency selector for selecting a frequency channel, the MCU reprogramming, through the serial register, the first clock shifter circuit to generate a shifted MCU clock frequency in response to the selected frequency channel being susceptible to internal subdivisions of the MCU clock signal; and the MCU reprogramming, through the serial register, the second clock shifter circuit to generate a shifted switched capacitor clock frequency in response to the selected frequency channel being susceptible to predetermined spurious harmonics of the switched capacitor clock frequency or subdivision of the switched capacitor clock frequency.

* * * * *